(12) United States Patent
Sasagawa et al.

(10) Patent No.: US 11,862,441 B2
(45) Date of Patent: Jan. 2, 2024

(54) PLASMA PROCESSING METHOD AND PLASMA PROCESSING APPARATUS

(71) Applicant: TOKYO ELECTRON LIMITED, Tokyo (JP)

(72) Inventors: Hironari Sasagawa, Miyagi (JP); Sho Kumakura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 100 days.

(21) Appl. No.: 17/330,729

(22) Filed: May 26, 2021

(65) Prior Publication Data

US 2021/0375602 A1 Dec. 2, 2021

(30) Foreign Application Priority Data

May 27, 2020 (JP) .................. 2020-092244

(51) Int. Cl.
*H01L 21/306* (2006.01)
*H01J 37/32* (2006.01)
*H01L 21/311* (2006.01)
*H01L 21/3065* (2006.01)

(52) U.S. Cl.
CPC .. *H01J 37/32935* (2013.01); *H01J 37/32449* (2013.01); *H01L 21/3065* (2013.01); *H01L 21/31116* (2013.01); *H01L 21/31144* (2013.01); *H01J 2237/334* (2013.01)

(58) Field of Classification Search
CPC .............. C23C 14/22; H01J 2237/334; H01L 2237/332; H01L 21/306
See application file for complete search history.

(56) References Cited

U.S. PATENT DOCUMENTS

| 2003/0132765 A1* | 7/2003 | Yamada ................. G01B 15/02 324/702 |
| 2016/0343580 A1 | 11/2016 | Hudson |
| 2018/0174858 A1* | 6/2018 | Hudson ............ H01L 21/31144 |

* cited by examiner

*Primary Examiner* — Thomas T Pham
(74) *Attorney, Agent, or Firm* — XSENSUS LLP

(57) ABSTRACT

A plasma processing method includes providing a substrate having a recess is provided in a processing container; generating plasma in the processing container to form a film on the recess; monitoring a state of the plasma generated in the generating; and determining necessity of re-execution of the generating and processing conditions for the re-execution based on the monitored plasma state.

18 Claims, 11 Drawing Sheets

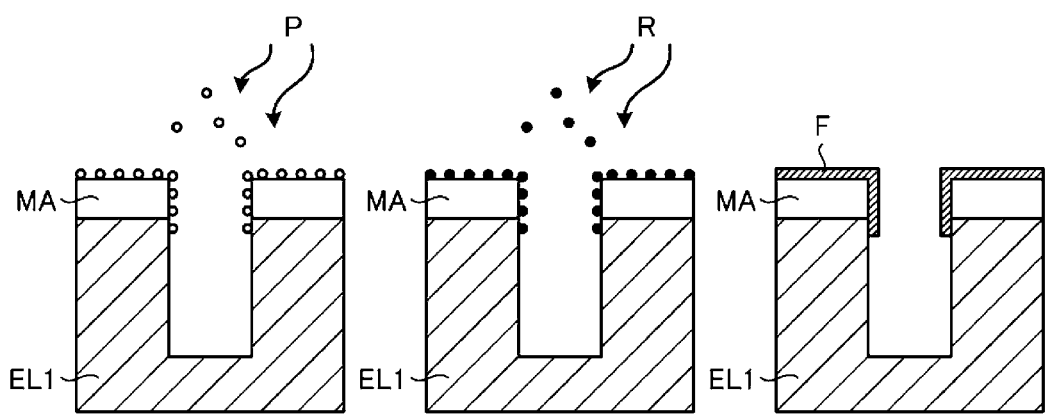
FIG. 5A   FIG. 5B   FIG. 5C

|   | ... | -3 | -2 | -1 | 0 | 1 | 2 | 3 | ... |
|---|---|---|---|---|---|---|---|---|---|
| ... | | | | | | | | | |
| 3 | | | | | 1 | 1 | | | |
| 2 | | | | 1 | 2 | 2 | 1 | 1 | |
| 1 | | | | | 2 | 3 | | 2 | 1 |
| 0 | | | 1 | 3 | 3 | 3 | 2 | 1 | |
| -1 | | | 1 | 2 | 3 | 2 | 2 | 1 | |
| -2 | | | 1 | 2 | 2 | 2 | 1 | 1 | |
| -3 | | | | 1 | 1 | 1 | 1 | 1 | |
| ... | | | | | | | | | |

FIG. 11A

| TIME STAMP | FIRST DETECTION RESULT | SECOND DETECTION RESULT | THIRD DETECTION RESULT | MONITORING RESULT | DETERMINATION RESULT | |
|---|---|---|---|---|---|---|
| ... | DIMENSION A | | | | NA | CONDITION X |
| ... | | DIMENSION B | | | RE-EXECUTE | CONDITION Y |
| ... | | | DIMENSION C | | DO NOT RE-EXECUTE | NA |
| ... | | | | V1 | RE-EXECUTE | CONDITION X |
| | | | | | | |

FIG. 11B

| TARGET PROCESS | DIMENSION OF COMPARISON TARGET | THRESHOLD VALUE |
|---|---|---|
| FIRST DETECTION PROCESS | DIMENSION AA | |
| SECOND DETECTION PROCESS | DIMENSION BB | TH2 |
| THIRD DETECTION PROCESS | DIMENSION CC | TH3 |
| DETERMINATION PROCESS | VV | TH |

PLASMA PROCESSING METHOD AND PLASMA PROCESSING APPARATUS

CROSS-REFERENCE TO RELATED APPLICATIONS

This application is based on and claims priority from Japanese Patent Application No. 2020-092244 filed on May 27, 2020 with the Japan Patent Office, the disclosure of which is incorporated herein in its entirety by reference.

TECHNICAL FIELD

The present disclosure relates to a plasma processing method and a plasma processing apparatus.

BACKGROUND

As the integration of a semiconductor device progresses in a vertical direction as well as in a horizontal direction, the aspect ratio of a pattern formed in the manufacturing process of the semiconductor device is also increasing. For example, in the manufacturing of a 3D NAND, a channel hole is formed in a direction in which the channel hole passes through many metal wiring layers. When memory cells of 64 layers are formed, the aspect ratio of the channel hole is as high as 45.

Various methods have been suggested in order to form a pattern having a high aspect ratio with high accuracy. For example, a method has been suggested in which etching and film formation are repeatedly executed for an opening formed in a dielectric material of a substrate so that lateral etching is suppressed (U.S. Patent Laid-open Publication No. 2016/0343580). In addition, a method has been suggested in which etching and film formation are combined, so that a protective film for preventing lateral etching of a dielectric layer is formed (U.S. Patent Laid-open Publication No. 2018/0174858).

SUMMARY

According to one aspect of the present disclosure, a plasma processing method realized by a plasma processing apparatus includes a process (a), a process (b), and a process (c). In the process (a), a substrate having a recess is provided in a processing container. In the process (b), plasma is generated in the processing container to form a film on the recess. In the process (c), a state of the plasma generated in the process (b) is monitored. Necessity of re-execution of the process (b) and a processing condition for the re-execution are determined based on the monitored plasma state.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 5A to 5C are views for explaining another example of the flow of sub-conformal ALD.

FIGS. 11A and 11B are views illustrating an example of information stored in a storage in the plasma processing according to the embodiment.

DETAILED DESCRIPTION

Figure 1:
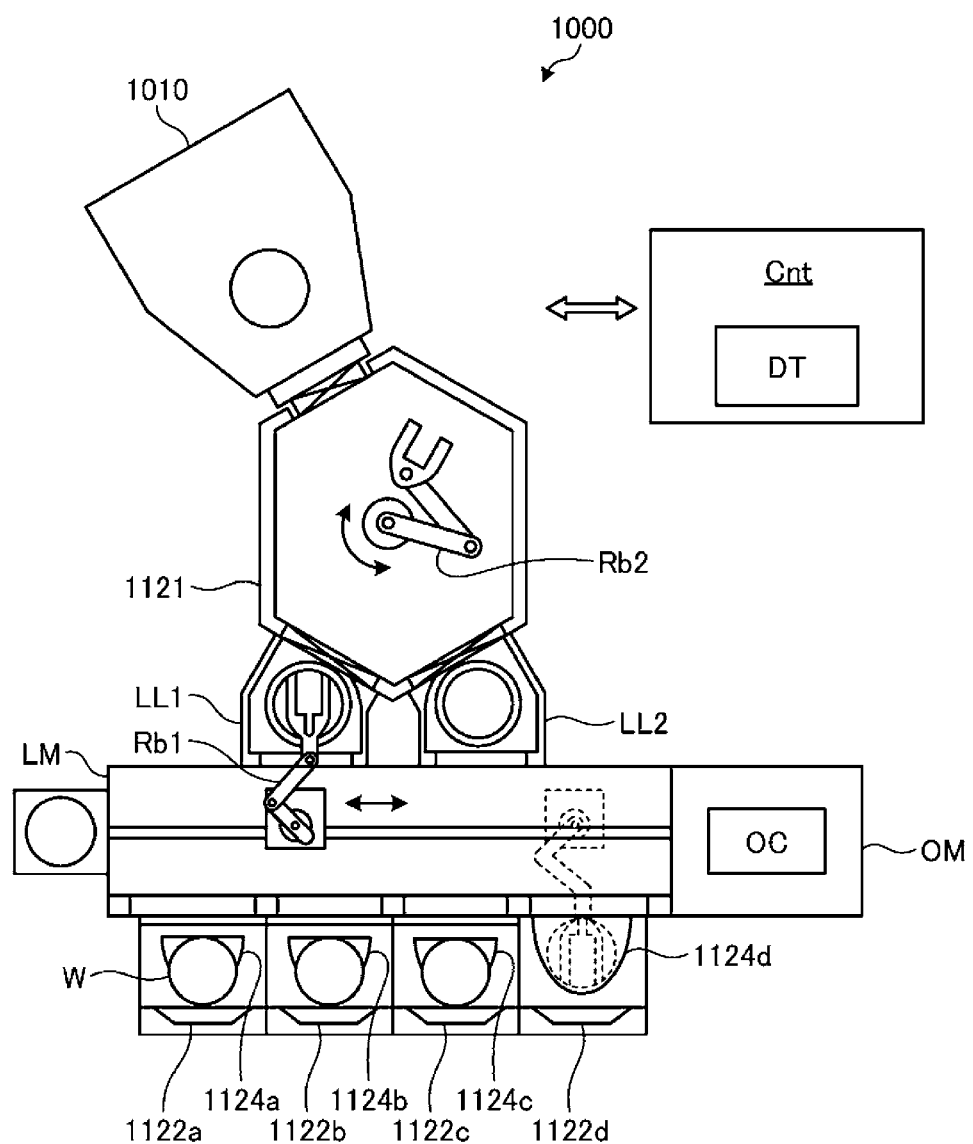
FIG. 1 is a view illustrating an example of the configuration of a plasma processing system according to an embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, the disclosed embodiments will be described in detail with reference to drawings. The embodiments are not limited. In addition, the embodiments may be properly combined in a range where processing contents do not contract with each other. In the drawings, the same or corresponding parts will be denoted by the same reference numerals.

In the following description, the "pattern" refers to the entire shape formed on a substrate. The pattern refers to all of the plurality of shapes formed on the substrate, such as, for example, a hole, a trench, and a line and space. In addition, the "recess" refers to a portion of a shape recessed in a thickness direction of the substrate, in the pattern formed on the substrate. In addition, he recess has a "side wall" as an inner peripheral surface of the recessed shape, a "bottom" as a bottom portion of the recessed shape, and a "top" that is a substrate surface continuous to the side wall, near the side wall. In addition, a space surrounded by the top is called an "opening." The term "opening" is also used to refer to the entire space surrounded by the bottom and the side wall of the recess, or any position of the space.

It is known that a shape abnormality is likely to occur when a deep hole having a high aspect ratio, such as a high aspect ratio contact (HARC), is formed. For example, a shape abnormality called bowing is known. The bowing is a shape abnormality in which when an opening is formed in a vertical direction, the inner peripheral surface of the opening bulges in a barrel shape in a lateral direction. In the embodiment, a film is formed on the side wall of the opening in order to suppress the occurrence of the shape abnormality such as bowing. Examples of the film formation method include atomic layer deposition (ALD), plasma-enhanced ALD (PEALD), chemical vapor deposition (CVD), plasma-enhanced CVD (PECVD), and plasma enhanced cyclic chemical vapor deposition (PECCVD).

(Configuration Example of Plasma Processing System According to Embodiment)

FIG. 1 is a view illustrating an example of a plasma processing system that may be used to carry out plasma processing according to the embodiment.

A plasma processing system 1000 illustrated in FIG. 1 includes a controller Cnt, a stage 1122a, a stage 1122b, a stage 1122c, a stage 1122d, a storage container 1124a, a storage container 1124b, a storage container 1124c, a storage container 1124d, a loader module LM, a load lock chamber LL1, a load lock chamber LL2, a transfer chamber 1121, and a plasma processing apparatus 1010. The plasma processing apparatus 1010 may be, for example, a plasma processing apparatus 1 illustrated in FIG. 2.

The controller Cnt is a computer including, for example, a processor, a storage, an input device, and a display device, and controls each of units (to be described later) in the plasma processing system 1000. The controller Cnt is connected to, for example, a transfer robot Rb1, a transfer robot Rb2, an observation device OC, and the plasma processing apparatus 1010. The controller Cnt may also double as a controller 100 of the plasma processing apparatus 1 illustrated in FIG. 2.

The controller Cnt sends out control signals by operating according to a computer program (a program based on an input recipe) for controlling each of units of the plasma processing system 1000. By the control signals from the controller Cnt, each of units of the plasma processing system 1000, for example, the transfer robots Rb1 and Rb2, and the observation device OC, and each of units of the plasma processing apparatus 1010 are controlled. In the plasma processing apparatus 1010, according to the control signals from the controller Cnt, it is possible to control the selection and the flow rate of a gas to be supplied from a gas supply source 15, the exhaust of an exhaust device 65, the power supply from radio-frequency power supplies 32 and 34, and the coolant flow rate and the coolant temperature. Each process of a substrate processing method according to the first and second embodiments may be executed when each of units of the plasma processing system 1000 is operated under the control by the controller Cnt. In the storage of the controller Cnt, a computer program for executing a plasma processing method according to the embodiment, and various data used for execution are stored in a readable manner.

The stages 1122a to 1122d are arranged along one edge of the loader module LM. The storage containers 1124a to 1124d are provided on the stages 1122a to 1122d, respectively. Wafers W may be accommodated in the storage containers 1124a to 1124d.

The transfer robot Rb1 is provided in the loader module LM. The transfer robot Rb1 takes out a wafer W accommodated in any one of the storage containers 1124a to 1124d, and transports the wafer W to the load lock chamber LL1 or LL2.

The load lock chambers LL1 and LL2 are provided along another edge of the loader module LM, and are connected to the loader module LM. The load lock chambers LL1 and LL2 constitute a preliminary decompression chamber. The load lock chambers LL1 and LL2 are individually connected to the transfer chamber 1121.

The transfer chamber 1121 is a chamber capable of being depressurized, and the transfer robot Rb2 is provided in the transfer chamber 1121. The plasma processing apparatus 1010 is connected to the transfer chamber 1121. The transfer robot Rb2 takes out the wafer W from the load lock chamber LL1 or the load lock chamber LL2, and transports the wafer W to the plasma processing apparatus 1010.

The plasma processing system 1000 includes the observation device OC. The observation device OC may be provided at any location in the plasma processing system 1000. As an example, the observation device OC is provided in an observation module OM adjacent to the loader module LM. The wafer W may be moved by the transfer robot Rb1 and the transfer robot Rb2, between the observation module OM and the plasma processing apparatus 1010. After the wafer W is accommodated in the observation module OM by the transfer robot Rb1, and the alignment of the wafer W is performed in the observation module OM, the observation device OC measures a groove width of, for example, a mask pattern on the wafer W, and transmits the measurement result to the controller Cnt. In the observation device OC, the groove width of, for example, a mask pattern formed on a plurality of regions of the top surface of the wafer W may be measured. The result of measurement by the observation device OC is used as, for example, a "detection result" in the embodiment to be described later (see FIGS. 11A and 11B). As for the observation device OC, for example, an optical observation device, a weight scale, and an ultrasonic microscope may be used.

(Configuration Example of Plasma Processing Apparatus According to Embodiment)

Figure 2:
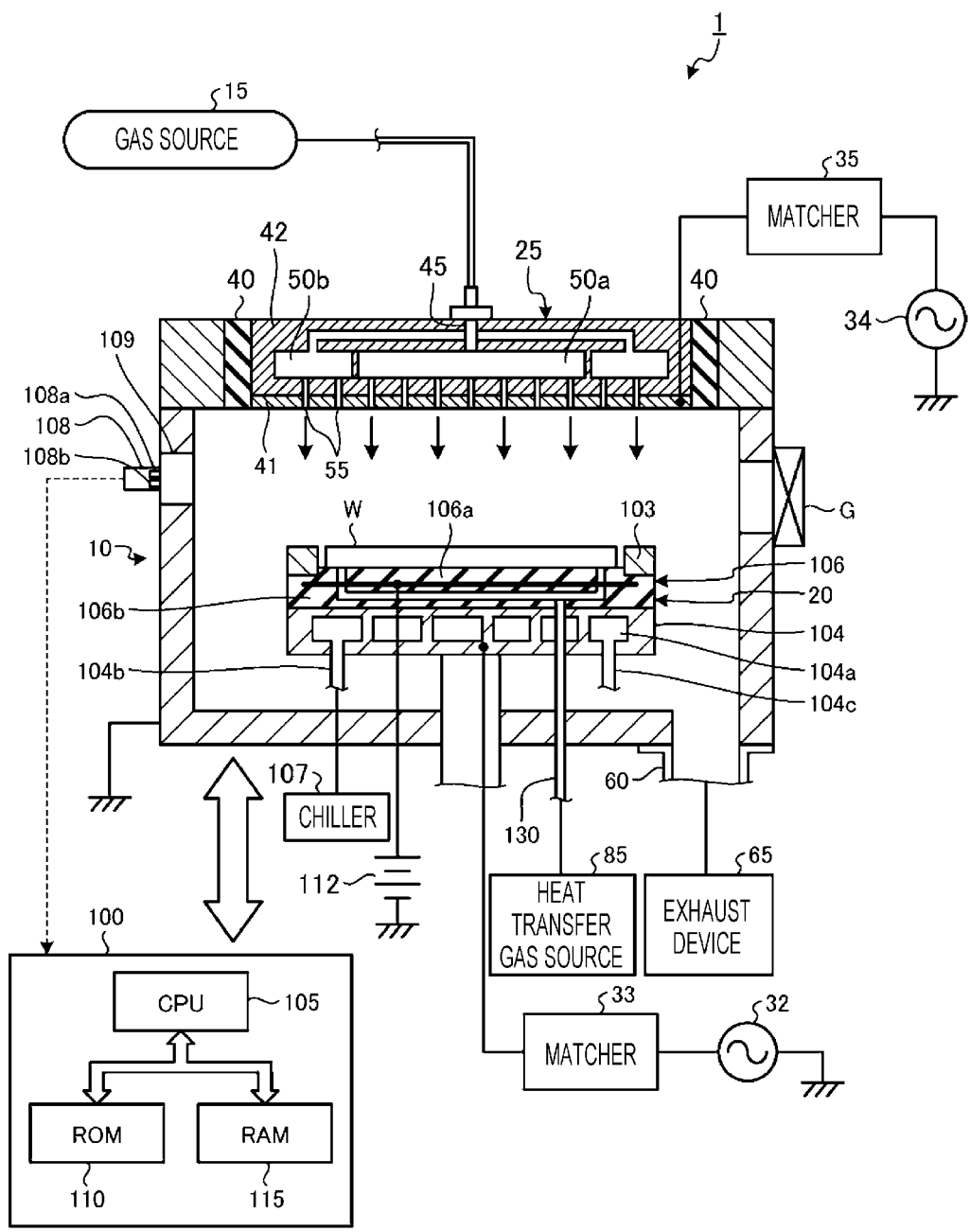
FIG. 2 is a view illustrating an example of the configuration of a plasma processing apparatus according to the embodiment.

The plasma processing apparatus 1 according to the embodiment of the present disclosure will be described with reference to FIG. 2. FIG. 2 illustrates a vertical cross section of an example of the configuration of the plasma processing apparatus 1 according to the embodiment. The plasma processing apparatus 1 according to the embodiment is a parallel plate type plasma processing apparatus (a capacitively coupled plasma processing apparatus) in which a stage 20 and a gas shower head 25 are disposed while facing each other in a processing container 10. The stage 20 has a function of holding a semiconductor substrate (hereinafter, simply referred to as a "wafer W") and functions as a lower electrode. The gas shower head 25 has a function of supplying a gas into the processing container 10, in a shower form, and functions as an upper electrode.

The processing container 10 is cylindrical and is made of, for example, aluminum whose surface has been subjected to an alumite treatment (an anodizing treatment). The processing container 10 is electrically grounded. The stage 20 is provided on the bottom of the processing container 10, and on the stage 20, the wafer W is placed. The wafer W is an example of a substrate as a plasma processing target.

The stage 20 is made of, for example, aluminum (Al), titanium (Ti), or silicon carbide (SiC). On the top surface of the stage 20, an electrostatic chuck 106 is provided to electrostatically attract the substrate. The electrostatic chuck 106 has a structure in which a chuck electrode 106a is interposed between insulators 106b.

A DC voltage source 112 is connected to the chuck electrode 106a, and a DC current is supplied from the DC voltage source 112 to the chuck electrode 106a. Accordingly, the wafer W is attracted to the electrostatic chuck 106 by a Coulomb force.

On the electrostatic chuck 106, an annular focus ring 103 is placed while surrounding the periphery of the wafer W. The focus ring 103 includes a conductive member, for example, silicon, and causes plasma to converge toward the top surface of the wafer W in the processing container 10 so as to improve the efficiency of etching.

The stage 20 is supported by a support 104. A coolant flow path 104a is formed inside the support 104. A coolant inlet pipe 104b and a coolant outlet pipe 104c are connected to the coolant flow path 104a. A cooling medium, such as, for example, cooling water or brine, output from a chiller 107 circulates through the coolant inlet pipe 104b, the coolant flow path 104a and the coolant outlet pipe 104c. Accordingly, the stage 20 and the electrostatic chuck 106 are cooled.

A heat transfer gas supply source 85 supplies a heat transfer gas such as helium gas (He) or argon gas (Ar) to the back surface of the wafer W on the electrostatic chuck 106 through a gas supply line 130. Through such a configuration, the temperature of the electrostatic chuck 106 is controlled by the cooling medium circulating through the coolant flow path 104a, and the heat transfer gas supplied to the back surface of the wafer W. As a result, the substrate may be controlled to a predetermined temperature.

The first radio-frequency power supply 34 is electrically connected to the gas shower head 25 via a matcher 35. The first radio-frequency power supply 34 applies radio-frequency power (HF) for plasma excitation of, for example, 60 MHz, to the gas shower head 25. In the embodiment, the radio-frequency power (HF) is applied to the gas shower head 25, but may be applied to the stage 20. The second radio-frequency power supply 32 is electrically connected to the stage 20 via a matcher 33. The second radio-frequency power supply 32 applies radio-frequency power (LF) for bias of, for example, 13.56 MHz, to the stage 20.

The matcher 35 matches a load impedance to an internal (or output) impedance of the first radio-frequency power supply 34. The matcher 33 matches a load impedance to an internal (or output) impedance of the second radio-frequency power supply 32. The matcher 35 and the matcher 33 function such that when plasma is generated in the processing container 10, the load impedances and the internal impedances of the first radio-frequency power supply 34 and the second radio-frequency power supply 32 are seemingly matched.

The gas shower head 25 includes a ceiling electrode plate 41 having many gas supply holes 55 and a cooling plate 42 on which the ceiling electrode plate 41 is detachably hung and supported. The gas shower head 25 is attached while closing the opening of a ceiling of the processing container 10 via a shield ring 40 that covers the periphery of the gas shower head 25. A gas introduction port 45 that introduces a gas is formed in the gas shower head 25. A center-side diffusion chamber 50a and an edge-side diffusion chamber 50b diverging from the gas introduction port 45 are provided in the gas shower head 25. A gas output from the gas supply source 15 is supplied to the diffusion chambers 50a and 50b through the gas introduction port 45, is diffused in each of the diffusion chambers 50a and 50b, and is introduced from the many gas supply holes 55 toward the stage 20.

An exhaust port 60 is formed on the bottom surface of the processing container 10, and the inside of the processing container 10 is exhausted by the exhaust device 65 connected to the exhaust port 60. Accordingly, the inside of the processing container 10 may be maintained at a predetermined degree of vacuum. A gate valve G is provided on the side wall of the processing container 10. By opening/closing of the gate valve G, the wafer W is loaded and unloaded into/from the processing container 10.

An optical sensor 108 capable of measuring the intensity of light of each wavelength in plasma in the processing container 10, through a quartz window 109, is attached to the plasma processing apparatus 1. The optical sensor 108 includes a first sensor 108a and a second sensor 108b. The first sensor 108a detects the state of plasma generated in the processing container 10. The detection result of the first sensor 108a is used in a monitoring process and a determination process (to be described later). In addition, the second sensor 108b detects a pattern shape on the top surface of the wafer W placed on the stage 20. The detection result of the second sensor 108b is used in first to third detection processes (to be described later).

The plasma processing apparatus 1 is provided with the controller 100 that controls operations of the entire apparatus. The controller 100 includes a central processing unit (CPU) 105, a read only memory (ROM) 110 and a random access memory (RAM) 115. The CPU 105 executes desired processes such as a film formation process, a monitoring process, a determination process, an etching process and first to third detection processes (to be described later) according to various recipes stored in these storage areas. In the recipes, for example, a process time, a pressure (exhaust of a gas), a radio-frequency power or a voltage, various gas flow rates, temperatures in the processing container 10 (for example, an upper electrode temperature, a side wall temperature of the processing container, and an electrostatic chuck temperature), and a temperature of the chiller 107 are described as apparatus control information related to process conditions. These recipes illustrating processing conditions or programs may be stored in a hard disk or a semiconductor memory. In addition, the recipes may be set at a predetermined position of a storage area while accommodated in a portable computer-readable storage medium such as a CD-ROM or a DVD.

The controller 100 executes a monitoring process (to be described later) of causing the first sensor 108a to monitor the plasma state in the processing container 10. In addition, the controller 100 executes a determination process (to be described later) of determining whether the re-execution of a film formation process is required based on the detection result of the first sensor 108a and determining a processing condition at the time of re-execution. In addition, the controller 100 performs first to third detection processes (to be described later) by detecting the pattern shape of the wafer W based on the detection result of the second sensor 108b.

At the time of plasma processing, the opening/closing of the gate valve G is controlled, and the wafer W is loaded into the processing container 10 and is placed on the stage 20. A DC current is supplied from the DC voltage source 112 to the chuck electrode 106a, so that the wafer W is attracted to and held by the electrostatic chuck 106 due to a Coulomb force.

Subsequently, a gas for plasma processing, radio-frequency power (HF) for plasma excitation, and radio-frequency power (LF) for bias are supplied into the processing container 10 to generate plasma. Plasma processing (for example, film formation and etching) is performed on the wafer W by the generated plasma.

After the plasma processing, a DC voltage (HV) having a positivity or a negativity opposite to that at the time of attraction of the wafer W is applied from the DC voltage source 112 to the chuck electrode 106a so as to remove electric charges of the wafer W, and separate the wafer W from the electrostatic chuck 106. The opening/closing of the gate valve G is controlled so that the wafer W is unloaded from the processing container 10.

(ALD and Sub-Conformal ALD)

In the embodiment, as for a film formation process, a process using plasma is executed. The film formation process is not particularly limited as long as it is a process using plasma. For example, as described above, the PEALD, the PECVD, and the PECCVD may be used.

Figure 3:
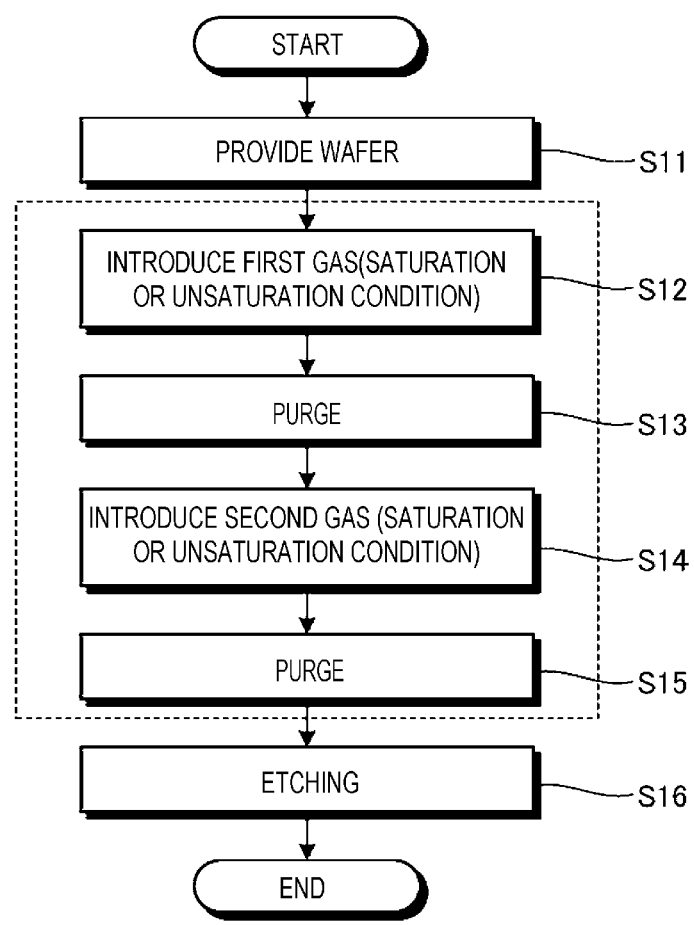
FIG. 3 is a flow chart illustrating the schematic flow of plasma processing according to the embodiment.

First, ALD and sub-conformal ALD will be described with reference to FIG. 3 to FIGS. 5A to 5C. FIG. 3 is a flow chart illustrating the schematic flow of plasma processing according to the embodiment. The processing flow illustrated in FIG. 3 is common to the case of ALD and the case of sub-conformal ALD. FIGS. 4A to 4D are views for explaining an example of the flow of the sub-conformal ALD. FIGS. 5A to 5C are views for explaining another example of the flow of the sub-conformal ALD.

First, a wafer W on which a pattern is formed is provided in the processing container 10 (step S11). The wafer W is automatically loaded from the gate valve G by the transfer robot Rb2. Then, a first gas (also called a precursor) is introduced from the gas supply source 15 to the processing container 10 where the wafer W is disposed (step S12). A first component contained in the first gas is adsorbed on the top surface of the wafer W. Then, the inside of the processing container 10 is exhausted (purged) by the exhaust device 65 (step S13). Next, a second gas (also called a reaction gas) containing a second component that reacts with the first component is introduced from the gas supply source 15 to the processing container 10 to generate plasma of the second gas (step S14). The second component forms a film by reacting with the first component on the wafer W. Then, the inside of the processing container 10 is exhausted again by the exhaust device 65 (step S15). The controller 100 causes each of units to further execute a process such as etching after the film formation in steps S12 to S15 (step S16). Then, the controller 100 ends the process in each of units of the plasma processing apparatus 1.

Herein, descriptions have been made to the effect that each process is executed in one plasma processing apparatus 1. Meanwhile, when the plasma processing system 1000 includes a plurality of plasma processing apparatuses 1010, the film formation process and the etching process may be executed in different plasma processing apparatuses 1010.

In the ALD, a predetermined component is adsorbed and is reacted on/with a substance pre-existing on the substrate surface in a self-control manner so as to form a film. Thus, in the ALD, a sufficient processing time is generally provided, and thus conformal film formation is realized. In the case of FIG. 3, a sufficient long processing time is set for step S12 and step S14. That is, processing conditions in step S12 and step S14 are set as saturation conditions. Accordingly, the adsorption of the first gas component on the wafer W, and the reaction between the first gas component and the second gas component reach saturation on the top surface of the wafer W so that a conformal film is formed. The conformal film is a film having a uniform thickness regardless of the position on the wafer W (for example, the position in the vertical direction).

Whereas, in the sub-conformal ALD, the same process procedure as that in the ALD is used, while a control is performed such that at least one of adsorption and reaction of the film formation components does not reach saturation. That is, in the sub-conformal ALD, the same process procedure as that in the ALD is used, while the self-controlling adsorption or reaction on the top surface of the wafer W is not completed so that a sub-conformal film is formed. The sub-conformal film is a film whose film thickness varies according to the position on the wafer W (for example, the position in the vertical direction).

At least the following two modes are present as processing modes of the sub-conformal ALD.

(1) A precursor is adsorbed on the entire surface of the wafer W. A reaction gas introduced thereafter is controlled so as not to spread throughout the entire surface of the wafer W.

(2) A precursor is adsorbed on only a part of the surface of the wafer W. A reaction gas introduced thereafter forms a film only on a portion of the surface on which the precursor is adsorbed.

By using the method (1) or (2), it is possible to form a film whose thickness is gradually decreased from top to bottom, on the side wall of the pattern formed on the wafer W.

A wafer W illustrated in FIGS. 4A to 4D includes an etching target film EL1, and a mask MA. A recess having an opening OP is formed in the stack of the etching target film EL1 and the mask MA.

Figures 4A, 4B:
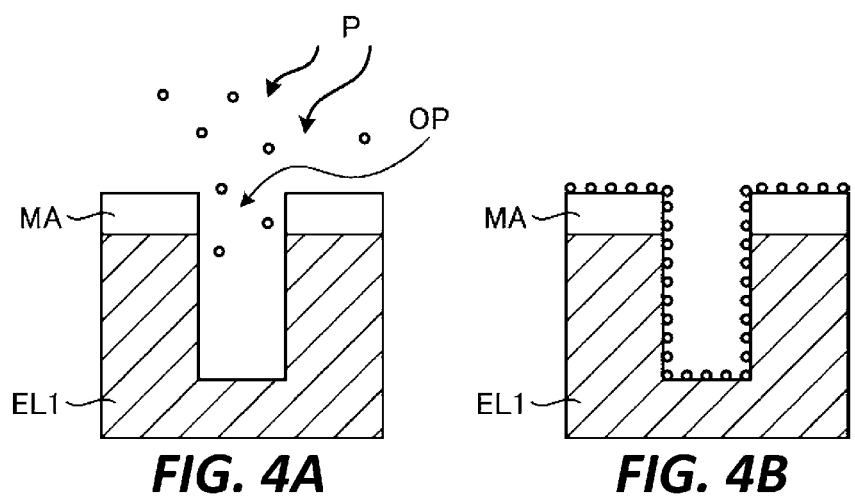
FIGS. 4A to 4D are views for explaining an example of the flow of sub-conformal atomic layer deposition (ALD).
Figures 4C, 4D:
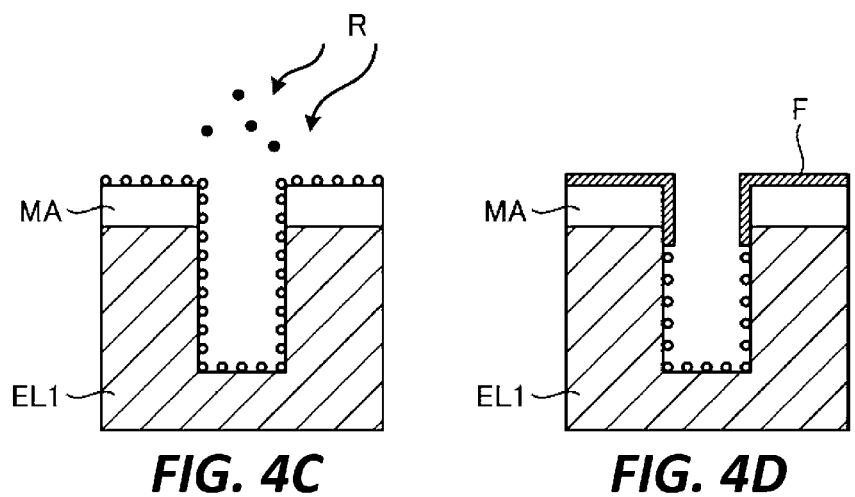

First, the wafer W is provided in the processing container 10 (step S11 in FIG. 3). Then, a precursor P is introduced into the processing container 10 in which the wafer W is disposed (FIG. 4A, and step S12 in FIG. 3). A sufficient processing time is provided to adsorb the precursor P so that the precursor P is adsorbed on the entire surface of the wafer W (FIG. 4B). When the adsorption of the precursor P is completed, the inside of the processing container 10 is purged. Next, a reaction gas R is introduced into the processing container 10 (FIG. 4C, and step S14 in FIG. 3). The introduced reaction gas R reacts with the precursor P on the wafer W and gradually forms a film F from the top side of the mask MA. Here, before the formation of the film F reaches the bottom side of the etching target film EL1, the reaction gas R is purged. Through a process performed in this manner, in using the ALD method, the film F may not be formed on the entire side wall of the recess, and may be formed only on the upper portions of the mask MA and the etching target film EL1 (FIG. 4D). In FIG. 4D, the film F is formed on the upper portion and the top of the side wall of the recess, and is not formed on the lower portion and the bottom of the side wall.

Next, the second method will be described with reference to FIGS. 5A to 5C. The wafer W illustrated in FIGS. 5A to 5C has the same shape as the wafer W in FIGS. 4A to 4D.

In the example of FIGS. 5A to 5C, the precursor P is adsorbed only on the upper portion of the wafer W (FIG. 5A). After the precursor P is purged, the reaction gas R is introduced to the processing container 10 (FIG. 5B). Here, since the reaction gas R forms a film through a reaction only at the location where the precursor P is adsorbed, the film F is formed only on the upper portion of the pattern of the wafer W (FIG. 5C).

(Processing Conditions for Selective Adsorption and Reaction)

FIGS. 4A to 4D correspond to a case where step S14 in FIG. 3 is executed under unsaturation conditions. In addition, FIGS. 5A to 5C correspond to a case where step S12 in FIG. 3 is executed under unsaturation conditions.

When the processing time in step S12 and step S14 is sufficiently long, the formed film becomes conformal rather than sub-conformal. Thus, in the sub-conformal ALD, processing conditions are set such that at least one of adsorption and reaction of the film formation components does not reach saturation.

Processing parameters to be adjusted to realize the sub-conformal ALD are, for example, the temperature of the stage 20 on which the wafer W is placed, the pressure in the processing container 10, the flow rate and the introduction time of the precursor to be introduced, the gas flow rate and the introduction time of the reaction gas to be introduced, and the processing time. In addition, in the case of a process using plasma, the film formation position may also be adjusted by adjusting the value of radio-frequency (RF) power to be applied for plasma generation. In the case of the process in FIG. 3, the second gas is formed into plasma in step S14, but the first gas of step S12 may also be formed into plasma.

(Example of Flow of Plasma Processing Method According to Embodiment)

Figure 6:
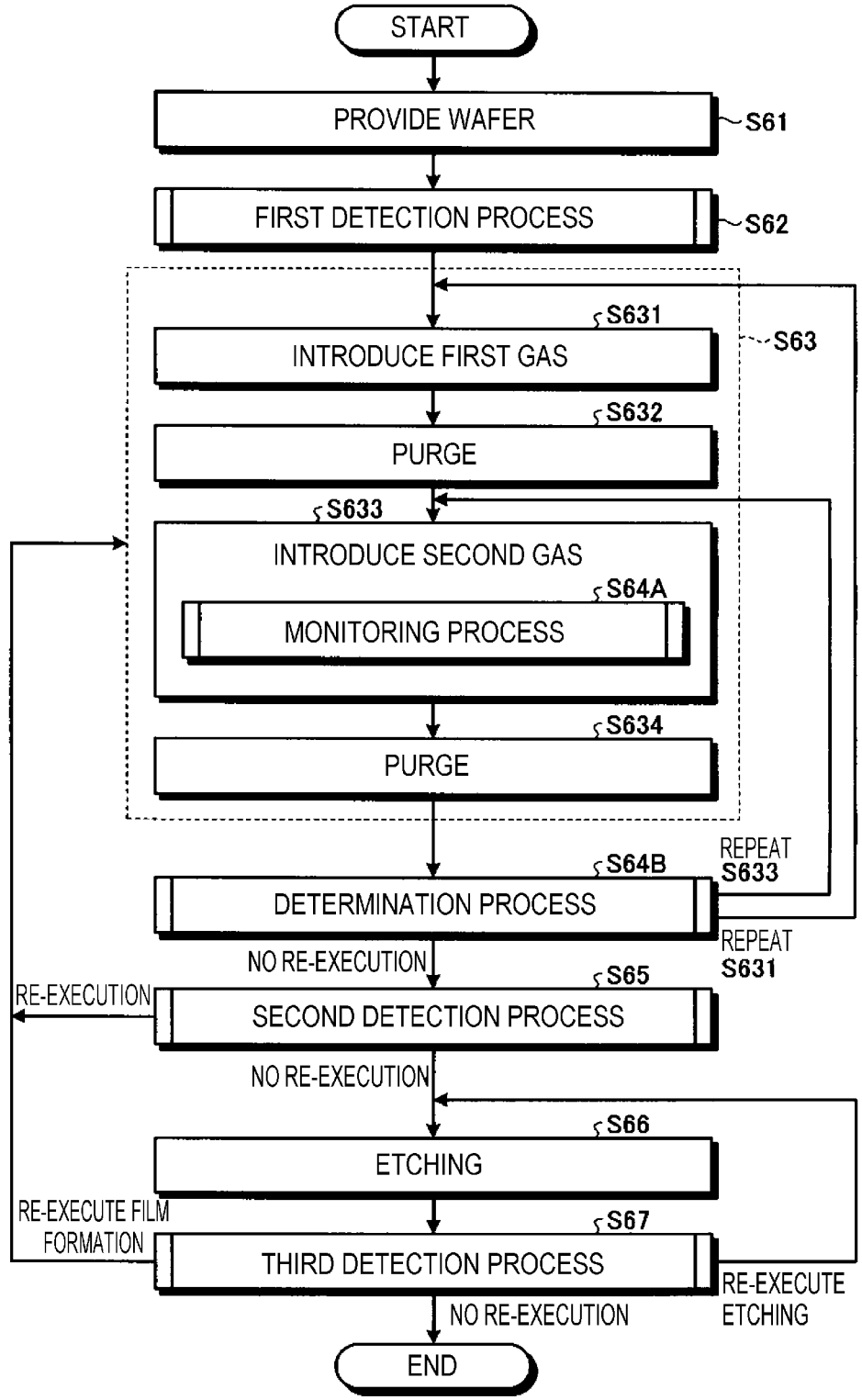
FIG. 6 is a flow chart for further explaining the plasma processing according to the embodiment.

FIG. 6 is a flow chart for further explaining a plasma processing method according to the embodiment. In the plasma processing method according to the embodiment, the state of plasma generated during a film formation process (steps S12 to S15 in FIG. 3) is monitored so as to realize highly accurate determination on the ending timing of the film formation process.

First, a wafer W is provided in the processing container 10 (step S61). A pattern is formed on the wafer W in advance. For example, the same recess as those in FIGS. 4A to 4D, and FIGS. 5A to 5C is formed. When both the etching and the film formation may be executed in the plasma processing apparatus 1, the formation of the recess may also be executed in the plasma processing apparatus 1.

Next, the plasma processing apparatus 1 executes a first detection process (step S62). The first detection process is a process in which the pattern shape on the wafer W is detected by the second sensor 108b or the observation device OC, so that the controller 100 determines processing conditions of a subsequent film formation process (step S63) based on the detection result. The pattern shape includes, for example, the aspect ratio of a recess or a surface profile. The first detection process may be performed at any time before or after the process of providing the wafer W (step S61) as long as the time is prior to the film formation process (step S63). The processing conditions of the film formation process (step S63) include, for example, the introduction amount of a first gas, the introduction amount of a second gas, a reaction time between the first gas and the second gas, a purging time, and the number of cycles. The first detection process will be described later.

The controller 100 sends an instruction to each of units of the plasma processing apparatus 1 based on the processing conditions determined by the first detection process, to start the film formation process (step S63). First, the controller 100 introduces the first gas from the gas supply source 15 into the processing container 10 (step S631). When the processing time determined by the processing conditions has elapsed, the controller 100 ends the introduction of the first gas. The first gas is adsorbed on the top surface of the wafer W on the stage 20.

Next, the controller 100 controls the exhaust device 65 to purge the gas in the processing container 10 (step S632).

Next, the controller 100 introduces the second gas from the gas supply source 15 into the processing container 10 (step S633). The controller 100 also applies radio-frequency power (HF) for plasma excitation from the first radio-frequency power supply 34 to the gas shower head 25. The controller 100 also applies radio-frequency power (LF) from the second radio-frequency power supply 32 to the stage 20. The radio-frequency power (HF) may also be applied to the stage 20. Due to application of the radio-frequency power (LF, HF), plasma of the second gas is generated in the processing container 10. Then, when the processing time based on the processing conditions determined by the first detection process has elapsed, the controller 100 ends the introduction of the second gas and the plasma generation. A component contained in the plasma of the second gas reacts with a component of the first gas on the top surface of the wafer W so as to form a film on the top surface of the wafer W.

In parallel with the introduction of the second gas, the controller 100 executes a monitoring process (step S64A). The monitoring process is a process in which the first sensor 108a monitors the plasma state in the processing container 10, and the monitoring result is transmitted to the controller 100, and is stored. Details of the monitoring process will be described later.

Next, the controller 100 controls the exhaust device 65 to purge the gas in the processing container 10 (step S634). Accordingly, one cycle of the film formation process (step S63) is completed.

Next, the controller 100 executes a determination process (step S64B) based on the monitoring result of the monitoring process (step S64A). The determination process is a process in which the controller 100 determines a subsequent process and processing conditions based on the monitoring result transmitted from the first sensor 108a. The determination process may be executed for each cycle of the film formation process (step S63), or may be executed after the film formation process (step S63) is performed for a predetermined number of cycles.

In the determination process, the controller 100 determines whether to re-execute the film formation process. In addition, when it is determined that the film formation process is to be re-executed, the controller 100 determines whether to repeat the process from the introduction of the first gas (step S631), or to repeat the process from the introduction of the second gas (step S633). In addition, when it is determined to re-execute the film formation process, the controller 100 selects processing conditions for the film formation process (step S63).

In FIG. 6, the determination process (step S64B) is executed after purging (step S634), but the determination process (step S64B) may be executed before purging or in parallel with purging.

The controller 100 continues the process based on the determination result in the determination process. When it is determined to perform repetition from step S631 (step S64B, repeat S631), the controller 100 repeats the above-described process in steps S631 to S634. Meanwhile, when it is determined to perform repetition from step S633 (step S64B, repeat S633), the controller 100 repeats the above-described process in steps S633 to S634. In addition, when it is determined not to re-execute the film formation process (step S64B, no re-execution), the controller 100 proceeds to a second detection process (step S65).

Similarly to the first detection process, the second detection process is a process in which the pattern shape on the wafer W is detected by the second sensor 108b or the observation device OC, so that based on the detection result, the controller 100 determines a subsequent process (the film formation process (step S63) or the etching (step S66)) and processing conditions. The processing conditions of the etching (step S66) include, for example, the introduction amount of an etching gas, radio-frequency power, and a substrate temperature. The second detection process will be described later.

When it is determined to re-execute the film formation process in the second detection process (step S65, re-execute), the controller 100 returns to step S63 and repeats the process. Meanwhile, when it is determined not to re-execute the film formation process in the second detection process (step S65, no re-execution), the controller 100 executes etching under the determined processing conditions (step S66). Here, as in the case of the introduction of the second gas, the controller 100 may simultaneously execute the monitoring process.

When the etching is ended, the controller 100 executes a third detection process (step S67). Similarly to the first and second detection processes, the third detection process is a process in which the pattern shape on the wafer W is detected by the second sensor 108b or the observation device OC, so that based on the detection result, the controller 100 determines a subsequent process and processing conditions. The third detection process will be described later.

When it is determined to re-execute the film formation process in the third detection process (step S67, re-execute film formation), the controller 100 returns to step S63 and repeats the process. In addition, when it is determined to re-execute the etching process in the third detection process (step S67, re-execute etching), the controller 100 returns to step S66 and repeats the process. Meanwhile, when it is determined to re-execute neither the film formation process nor the etching process in the third detection process (step S67, no re-execution), the controller 100 ends the process. Accordingly, the plasma processing of the embodiment is ended.

(Monitoring Process/Determination Process)

Figure 7:
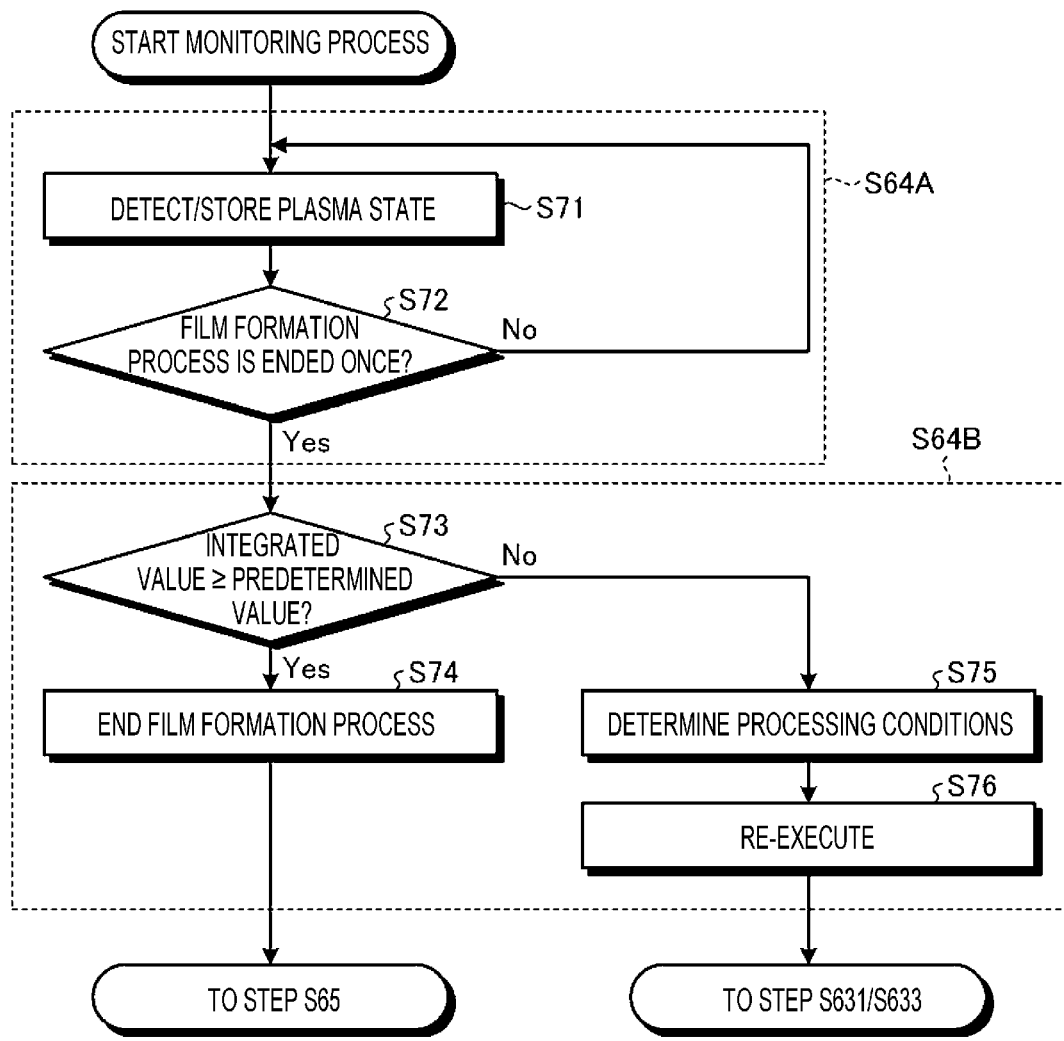
FIG. 7 is a flow chart for explaining a monitoring process and a determination process according to the embodiment.

Next, the monitoring process in step S64A and the determination process in step S64B will be described. FIG. 7 is a flow chart for explaining the monitoring process and the determination process according to the embodiment. In the plasma processing according to the embodiment, in the monitoring process, the controller 100 monitors the state of the plasma generated during the film formation process. Then, based on the result of the monitoring process, the controller 100 executes the determination process of determining the ending timing of the film formation process.

As described above, the monitoring process (step S64A) is executed in parallel with the process of introducing the second gas into the processing container 10 and forming the second gas into plasma, in the film formation process (step S63). Here, it is assumed that the monitoring process is started at a point in time when the processing of one wafer W is started.

When the processing of the wafer W is started, the controller 100 causes the first sensor 108a to start the monitoring process. When the second gas is introduced into the processing container 10 and step S633 is started, the first sensor 108a detects the plasma state in the processing container 10 (step S71). The timing when the first sensor 108a starts to operate is not particularly limited, and the controller 100 may control the first sensor 108a based on the processing recipe of the wafer W such that the processing is started. In the monitoring process, the first sensor 108a monitors, for example, the amount of radicals generated by the plasma generation of the second gas.

By the way, the coverage of the film formed on the pattern in the film formation process is determined by the temperature in the processing container 10, the aspect ratio of the pattern as a processing target, and the dose amount of radicals generated in the processing container 10. In the film formation process of the embodiment, the temperature in the processing container 10 is controlled by the predetermined processing condition, and the aspect ratio of the pattern may be derived from a design value in advance. Thus, if it is possible to know the dose amount of radicals during the film formation process, the coverage of the film to be formed by the film formation process may be estimated. Here, the coverage indicates the state of the film, including the thickness and the position of the formed film. For example, the coverage means a change in the film thickness according to the aspect ratio.

The amount of radicals included in the plasma may be estimated from, for example, an electron density, and an ion density of the plasma. Therefore, although the amount of radicals is not directly monitored, another physical quantity indicating the plasma state only has to be monitored. The physical quantities indicating the plasma state may include, for example, an electron density, an ion density, a molecular•radical density, and an atomic•molecular ion mass.

These physical quantities indicating the plasma state may be measured by, for example, spectroscopy (including those using laser), or an interference•reflection method. As for the spectroscopy, emission spectroscopy for measuring, for example, a radiant flux, an emission spectrum intensity, or a continuous spectrum intensity may be used. In addition, absorption spectroscopy such as a total absorption method, a self-absorption method, or a hook method may be used. In addition, spectroscopy using laser may be used. For example, a laser organic fluorescence method, a laser absorption spectroscopy, and a laser scattering method may be used. In addition, a microwave interferometry/reflection method, a laser interferometry/polarization method, or a Schlieren/shadow graph method may be used.

The first sensor 108a is a detection device capable of monitoring the physical quantity indicating the plasma state. As long as the physical quantity indicating the plasma state can be monitored, a specific configuration of the first sensor 108a is not particularly limited. For example, as for the first sensor 108a, an emission spectroscopic (Optical Emission Spectroscopy: OES) sensor may be used. In addition, as for the first sensor 108a, an ultra-high resolution image sensor may be used. Then, information acquired by the first sensor 108a, for example, an image, may be analyzed by the controller 100 so that the physical quantity may be calculated.

The first sensor 108a monitors the physical quantity indicating the state of plasma generated during the process in step S633, and transmits the monitoring result to the controller 100. The controller 100 stores the received monitoring result in association with the timing.

The controller 100 determines whether the film formation process (steps S631 to S634) has ended (step S72). When it is determined that the film formation process has not ended (step S72, No), the controller 100 returns to step S71, and continues the monitoring process by the first sensor 108a. Meanwhile, when it is determined that the film formation process has ended (step S72, Yes), the controller 100 proceeds to step S73 and executes the determination process.

(Determination Process)

Figure 8:
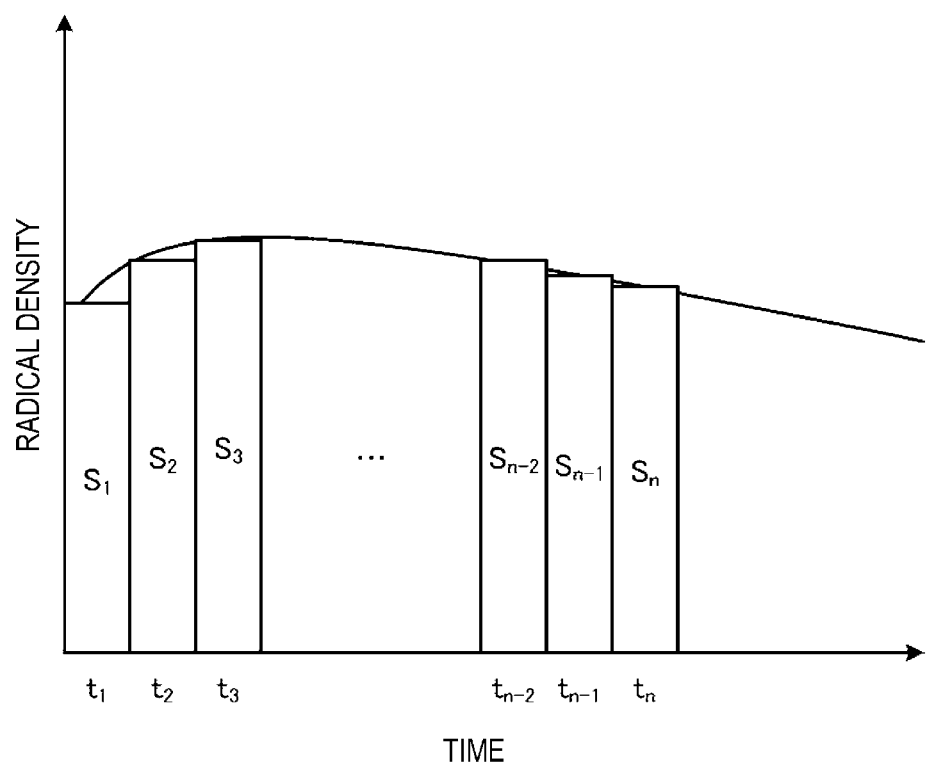
FIG. 8 is a view for explaining the monitoring result obtained in the monitoring process according to the embodiment.

In the determination process, the controller 100 calculates the integrated value on the physical quantity at each timing which is obtained by the monitoring process. The physical quantity obtained by the monitoring process is stored in the controller 100 in association with the timing. FIG. 8 is a view for explaining the monitoring result obtained in the monitoring process according to the embodiment. In the example of FIG. 8, it is assumed that the first sensor 108a monitors the amount of radicals in the plasma at every predetermined time ($t_1$, $t_2$, $t_3$ . . . ) and sends the amount as a numerical value to the controller 100. Here, the monitored amount of radicals changes while the curve in FIG. 8 is drawn. The controller 100 calculates the integrated value of the monitoring results from the processing start of the wafer W to that point in time. In the example of FIG. 8, the controller 100 calculates the total value of $S_1$, $S_2$, $S_3$ . . . .

Next, the controller 100 determines whether the calculated integrated value is equal to or greater than a predetermined value (step S73). Here, the "predetermined value" is calculated in advance as an amount of radicals required until a desired coverage is reached, based on the aspect ratio of the pattern on the wafer W, the temperature in the processing container 10, and the desired coverage.

When it is determined that the calculated integrated value is equal to or greater than the predetermined value (step S73, Yes), the controller 100 ends the film formation process (step S74). That is, in step S64B of FIG. 6, the controller 100 proceeds to the branch of "no re-execution," and then executes step S65.

Meanwhile, when it is determined that the calculated integrated value is less than the predetermined value (step S73, No), the controller 100 determines processing conditions for re-execution of the film formation process (step S75). The determined processing conditions may include processing times at the time of re-execution of steps S631 and S633. For example, from the integrated value calculated in step S73, if the processing times of steps S631 and S633 to be subsequently executed are set to have the same lengths as those in the previous time, in the case where a desired coverage is exceeded, the controller 100 sets short processing times for steps S631 and S633. In addition, the determined processing conditions may include a determination on whether to start the re-execution from step S631 or from step S633. Then, the controller 100 re-executes the film formation process under the determined processing conditions (step S76). Then, the controller 100 proceeds to step S631 or step S633 according to the determined processing conditions.

Since the controller 100 determines the degree of progress of the film formation process of the wafer W by the integrated value, for example, in the case where the plasma processing apparatus 1 is forcibly ended during the processing, it is possible to determine processing conditions subsequent to the recovery of the plasma processing apparatus 1.

(Monitoring Method Example 1 of First Sensor 108a)

By the way, the first sensor 108a may monitor the plasma state on a basis of a point, a plane, or a three-dimension. Next, examples of a monitoring method in the monitoring process will be described.

In Method Example 1 of detecting a physical quantity in the monitoring process according to the embodiment, when the first sensor 108a is disposed on the side surface of the processing container 10 as illustrated in FIG. 2, an image obtained by monitoring the plasma state on a basis of a plane in the direction of the side surface of the processing container 10 is used. The first sensor 108a is, for example, an ultra-high resolution image sensor.

In Method Example 1, plasma is displayed as a whitish object which is gradually diffused in the processing space with the lapse of time, in the obtained image. The diffusion or the intensity of the plasma corresponds to saturation or brightness of the white portion in the image. Thus, the controller 100 may acquire the value indicating the plasma state by analyzing the brightness or the saturation of the white portion in the obtained image.

The first sensor 108a transmits the acquired image to the controller 100. The controller 100 analyzes the received image, and performs calculation of converting the plasma state into a numerical value based on, for example, the saturation or the brightness of the image. Then, the integrated value of the calculated numerical values is compared to a predetermined threshold value (the "predetermined value" in FIG. 7). Through a process performed in this manner, the controller 100 may estimate the film formation state on the wafer W, and determine the ending timing of the film formation process based on the plasma state in the vicinity of the wafer W placed in the processing container 10.

(Monitoring Method Example 2 of First Sensor 108a)

Figures 9A, 9B:
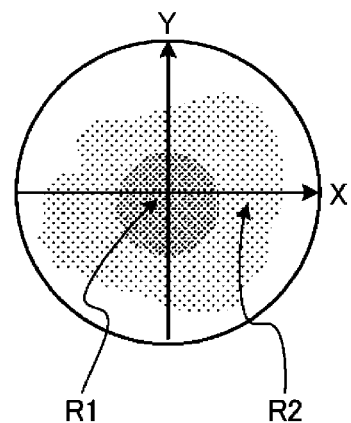
FIG. 9A is a view for explaining Method Example 2 of detecting a physical quantity in the monitoring process according to the embodiment.
FIG. 9B is a view illustrating an example in which an image obtained by Method Example 2 of FIG. 9A is digitized.

In addition, unlike that illustrated in FIG. 2, the first sensor 108a may be disposed not to monitor the processing space in the vicinity of the wafer W in the lateral direction of the processing container 10 but to perform monitoring from above the processing container 10 downwards. FIG. 9A is a view for explaining Method Example 2 of detecting a physical quantity in the monitoring process according to the embodiment.

As illustrated in FIG. 9A, in Method Example 2, the first sensor 108a monitors the entire surface of the wafer W from above. In the image illustrated in FIG. 9A, a portion R1 having a relatively large amount of radicals is displayed as a dark pattern, and a portion R2 having a relatively small amount of radicals is displayed as a light pattern. The first sensor 108a acquires such an image at every predetermined time (for example, every 50 nanoseconds). Then, the first sensor 108a transmits the acquired image to the controller 100.

The controller 100 analyzes the image received from the first sensor 108a, and digitizes the shade of a color corresponding to the amount of radicals. FIG. 9B is a view illustrating an example in which the image obtained by Method Example 2 of FIG. 9A is digitized. In the example illustrated in FIG. 9B, 1, 2, and 3 as digitized values of color shades are displayed at positions corresponding to the regions (R1 and R2) in FIG. 9A. First, the controller 100 divides a region including the plane of the wafer W into a plurality of regions having uniform areas. Then, an image corresponding to each region is analyzed and is digitized. Accordingly, the controller 100 may obtain the integrated value of values indicating the plasma state in each region for each image.

As illustrated in FIG. 9A and FIG. 9B, when the plane of the wafer W is divided into a plurality of regions and a numerical value indicating the plasma state of each region is obtained, the controller 100 may determine the film formation state at each in-plane position of the wafer W. Thus, the controller 100 may also use the result of the monitoring process in improving the in-plane uniformity of the plasma processing. For example, according to the result of the monitoring process, the controller 100 may adjust the radio-frequency power to be applied to the stage 20 and the gas shower head, among processing conditions for a subsequent process, to different values depending on the in-plane position.

Figure 10:
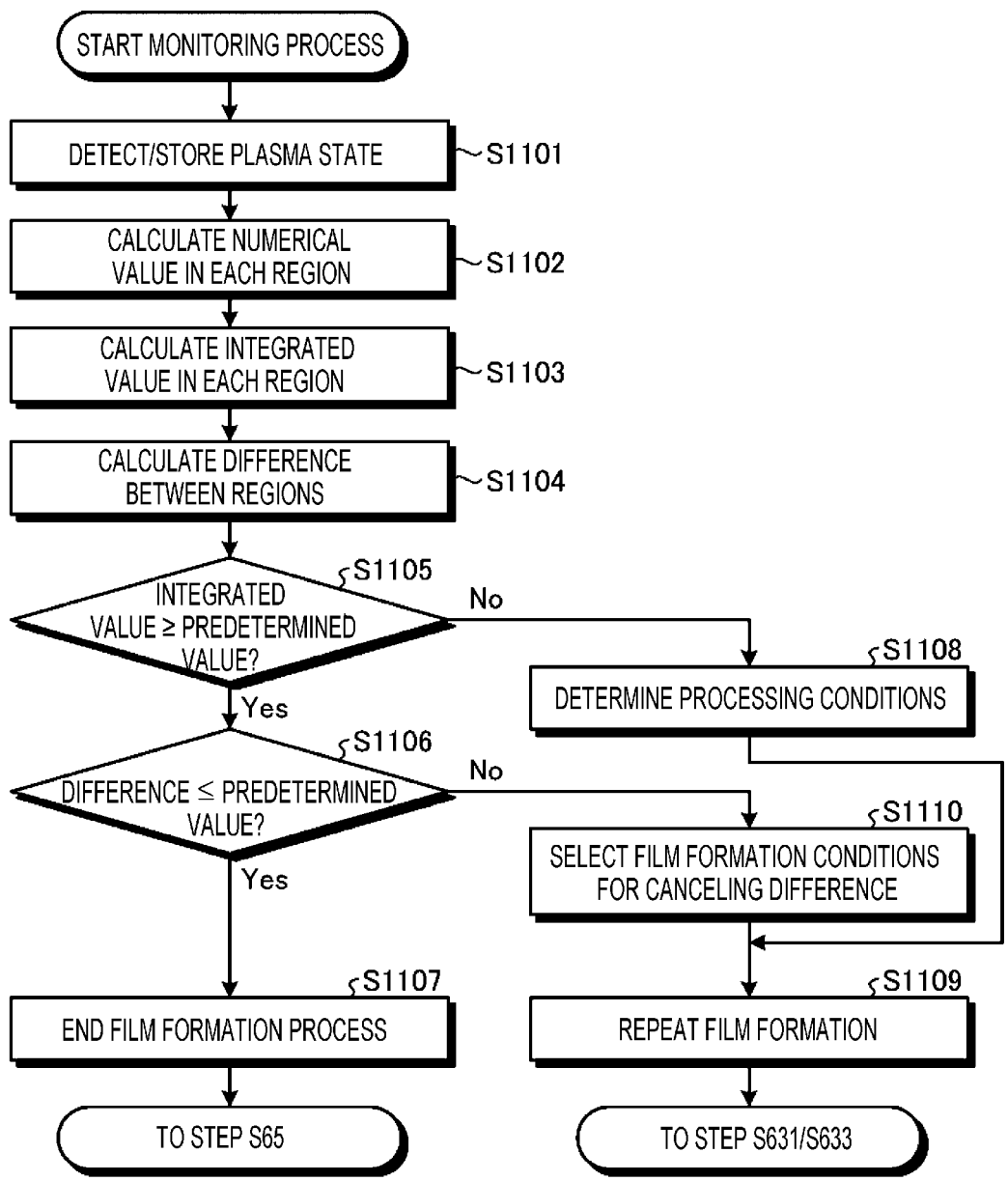
FIG. 10 is a flow chart illustrating an example of the flow of the monitoring process based on Method Example 2 in FIGS. 9A and 9B.

FIG. 10 is a flow chart illustrating an example of the flow of the monitoring process based on Method Example 2 in FIG. 9A and FIG. 9B. In the example of FIG. 10, first, when the monitoring process is started, the first sensor 108a starts to monitor the plasma state, and the acquired information is transmitted to the controller 100 and is stored (step S1101). Here, the first sensor 108a monitors the entire surface of the wafer W.

The controller 100 analyzes the received information, for example, an image, and calculates a numerical value indicating the plasma state for each of preliminary set regions (step S1102). Then, for each of the regions, the controller 100 calculates an integrated value in the film formation process executed until now, based on the calculated numerical values (step S1103). The controller 100 calculates a difference in the calculated integrated value between the regions (step S1104).

Next, the controller 100 determines whether the integrated value calculated in step S1103 is equal to or greater than a predetermined value (step S1105). Then, when it is determined that the integrated value is equal to or greater than the predetermined value (step S1105, Yes), the controller 100 determines whether the difference calculated in step S1104 is equal to or lower than a predetermined value (step S1106). Then, when it is determined that the difference is equal to or lower than the predetermined value (step S1106, Yes), the controller 100 ends the film formation process (step S1107). Then, the controller 100 proceeds to step S65.

Meanwhile, when it is determined that the integrated value calculated in step S1103 is less than the predetermined value (step S1105, No), the controller 100 determines processing conditions for re-executing the film formation process (step S1108). Then, the film formation process based on the determined processing conditions is executed (step S1109). In this case, the film formation process is re-executed based on the processing conditions determined in step S1108 and the processing step (S631 or S633) as a re-execution target.

Meanwhile, when it is determined that the difference calculated in step S1104 is greater than the predetermined value (step S1106, No), the controller 100 determines processing conditions for canceling the difference in order to improve the in-plane uniformity (step S1110). Then, the controller 100 re-executes the film formation process based on the determined processing conditions (step S1109). Subsequently, the process proceeds to step S631 or S633. Accordingly, the monitoring process of Method Example 2 is ended.

As described above, in the plasma processing according to the embodiment, by monitoring the plasma state in the processing container 10, it is possible to estimate the film formation state without inspecting the pattern itself on the wafer W. Thus, the plasma processing apparatus 1 according to the embodiment may highly accurately and simply determine the ending timing of the film formation process.

Next, the first to third detection processes will be described. Here, descriptions will be made on the assumption that the detection in the first to third detection processes is executed by the second sensor 108b. Meanwhile, the detection in the first to third detection processes may be executed by the observation device OC after the wafer W is transported to the observation module OM illustrated in FIG. 1.

(First Detection Process)

The first detection process includes a process of detecting the shape or the dimension of the pattern on the wafer W by the second sensor 108b, and a process of determining processing conditions of a subsequent process by the controller 100 based on the detection result of the second sensor 108b.

The second sensor 108b detects the shape or the dimension of the pattern on the wafer W through an optical method. The detection method by the second sensor 108b is not particularly limited. The result of detection by the second sensor 108b is transmitted to the controller 100, and is stored in the storage such as the ROM 110, or the RAM 115.

When the detection result is received, the controller 100 compares the detection result to a predetermined pattern dimension. Then, a difference between the predetermined pattern dimension and the detected dimension is calculated. The controller 100 adjusts processing conditions of a subsequent process based on the calculated difference. Then, the controller 100 determines processing conditions to be used in the subsequent process.

At a point in time when the wafer W is disposed in the processing container 10, in the case where the pattern formed on the wafer W deviates from a design value, when a subsequent process is executed under processing conditions based on a design, there is a high possibility that the state of a film to be finally formed may deviate from a design value. Therefore, in the embodiment, in the first detection process, the processing conditions are adjusted based on a difference between the design value and the actually measured value.

(Second Detection Process)

The second detection process includes a process of detecting the shape or the dimension of the pattern on the wafer W by the second sensor 108b, and a process of determining a subsequent process and processing conditions by the controller 100 based on the detection result of the second sensor 108b.

The detection process of the second sensor 108b in the second detection process is the same as the detection process in the first detection process. Meanwhile, at the time of execution of the second detection process, since the film formation process has ended, the shape of the pattern formed on the wafer W is different from that at the time of the first detection process. In addition, in the process of the controller 100, a predetermined pattern dimension to be compared to the detection result is also different from that at the time of the first detection process.

When the detection result is received, the controller 100 compares the detection result to the predetermined pattern dimension. Then, a difference between the predetermined pattern dimension and the detected dimension is calculated. The controller 100 determines whether to re-execute the film formation process (step S63) based on the calculated difference. For example, when the calculated difference is equal to or greater than a threshold value, the controller 100 determines to re-execute the film formation process. Meanwhile, when the calculated difference is less than the threshold value, the controller 100 determines not to re-execute the film formation process.

When it is determined not to re-execute the film formation process, next, the controller 100 determines processing conditions of subsequent etching (step S66). For example, when the numerical value of the thickness of the film formed on the pattern, which is obtained from the detection result, is greater than a set value, the processing conditions are adjusted such that the etching effect becomes stronger. Then, the controller 100 determines the adjusted processing conditions, as processing conditions for etching (step S66).

When the second sensor 108b used in the second detection process is, for example, an infrared sensor, the second sensor 108b may directly measure the thickness of the film formed on the pattern. In this case, the controller 100 calculates a difference by comparing the result of detection by the second sensor 108b to a predetermined film thickness. Then, the controller 100 determines whether to re-execute the film formation process (step S63) based on the calculated difference. Then, the controller 100 determines a subsequent process and processing conditions.

(Third Detection Process)

The third detection process includes a process of detecting the shape or the dimension of the pattern on the wafer W by the second sensor 108b, and a process of determining a subsequent process and processing conditions by the controller 100 based on the detection result of the second sensor 108*b*.

The detection process of the second sensor 108*b* in the third detection process is the same as the detection process in the first and second detection processes. Meanwhile, at the time of execution of the third detection process, since the film formation process and the etching process have ended, the shape of the pattern formed on the wafer W is different from that at the time of the first and second detection processes. In addition, in the process of the controller 100, a predetermined pattern dimension to be compared to the detection result is also different from that at the time of the first and second detection processes.

When the detection result is received, the controller 100 compares the detection result to the predetermined pattern dimension. Then, a difference between the predetermined pattern dimension and the detected dimension is calculated. The controller 100 determines whether to re-execute the film formation process (step S63) based on the calculated difference. For example, when the calculated difference is equal to or greater than a threshold value, and the detected dimension is smaller than the predetermined pattern dimension, the controller 100 determines to re-execute the film formation process. Meanwhile, when the calculated difference is less than the threshold value, the controller 100 determines not to re-execute the film formation process. In addition, the controller 100 determines whether to re-execute the etching process (step S66) based on the calculated difference. For example, when the calculated difference is equal to or greater than the threshold value, and the detected dimension is larger than the predetermined pattern dimension, the controller 100 determines to re-execute the etching process.

When it is determined to re-execute the film formation process, next, the controller 100 determines processing conditions of the film formation process. For example, the processing conditions are determined such that a difference between a pattern shape obtained from the detection result and the predetermined pattern dimension is reduced. Then, the controller 100 executes the film formation process by using the determined processing conditions (FIG. 6, step S67, "re-execute film formation").

In addition, when it is determined to re-execute the etching process, next, the controller 100 determines processing conditions of the etching process. For example, the processing conditions are determined such that a difference between a pattern shape obtained from the detection result and the predetermined pattern dimension is reduced. Then, the controller 100 executes the etching process by using the determined processing conditions (FIG. 6, step S67, "re-execute etching"). When it is determined to re-execute neither the film formation process nor the etching process (FIG. 6, step S67, "no re-execution"), the controller 100 ends the process.

All of the first detection process, the second detection process and the third detection process may be realized by using the same detector, for example, the second sensor 108*b* or the observation device OC, or different detectors may be used for the processes, respectively. In addition, the determination process may be executed by the controller 100, or the first sensor 108*a* may have a determination function so that a numerical value and a time stamp may be transmitted to the controller 100.

FIGS. 11A and 11B are views illustrating an example of information stored in the storage in the plasma processing according to the embodiment. In the example illustrated in FIG. 11A, the results detected in the first detection process, the second detection process, and the third detection process are stored in association with "time stamp." Here, the detection result may be a specific dimension. In addition, shape abnormalities may be categorized in advance and a plurality of types may be defined, so that a type corresponding to the detection result may be stored. In FIG. 11A, the detection results are categorized and are stored as, for example, "dimension A," "dimension B," etc. In addition, as the result of the monitoring process, numerical values associated with a plurality of time stamps may be stored, in associated with a time stamp each time step S633 is executed once. In addition, when the first sensor 108*a* is an image sensor, a plurality of images themselves may be stored. In FIG. 11A, as the monitoring result, a value "V1" obtained by digitizing each of images acquired during step S633, and integrating the digitized values is stored. In addition, in FIG. 11A, as the "determination result", results of the first to third detection processes and the determination process are stored. For example, in the first detection process, a processing condition "X" for a subsequent process is stored. For example, in the second detection process, "re-execute" indicating re-execution of the film formation process, and a processing condition "Y" for the re-execution are stored. "Y" also includes information that identifies the step in which the process is executed. In addition, in the third detection process, "do not re-execute" indicating that neither etching nor film formation is re-executed is stored. In addition, due to no re-execution, "NA" (not applicable) is stored in the column of the processing condition. In addition, "re-execute" and "condition X" are stored in association with the monitoring process "V1." This indicates that in the determination process, it has been determined that the film formation process is to be re-executed, and the corresponding processing condition is "X."

In addition, FIG. 11B is a configuration example when a dimension or a threshold value to be compared to a detection result in each process is stored in the storage. For example, in the first detection process, the detection result is compared to "dimension AA" so as to determine the processing condition of a subsequent process. FIGS. 11A and 11B are an example, and the configuration of information stored in the storage to execute the first to third detection processes, the monitoring process and the determination process is not particularly limited.

(Modification)

In the above-described embodiment, the detection result of the first detection process (step S62), the monitoring result of the monitoring process (step S64A), the detection result of the second detection process (step S65), and the detection result of the third detection process (step S67) are used in, for example, adjusting processing conditions, and determining re-execution necessity of each process, in regard to the wafer W on which the processes have been executed. However, these detection results and the monitoring result may also be applied to not only the wafer W on which the processes have been executed, but also a wafer W' to be processed after the wafer W. That is, a series of processes (steps S61 to S67) are executed on the wafer W, and data is acquired in regard to, for example, the shape of the recess before the film formation process, the plasma state in the film formation process, the state of the film formed by the film formation process, and the state of the film and the shape of the pattern after the etching. Then, correlation between these is obtained. As an example, correlation is obtained in regard to the shape of the recess before the film formation process, the plasma state in the film formation process, and the state of the film formed by the film formation process. In another example, correlation is obtained in regard to the plasma state in the film formation process, the state of the film formed by the film formation process, and the state of the film and the pattern shape after the etching. These correlations may be stored as physical models in the storage in the controller Cnt. Then, conditions of the film formation process (step S63) or the etching (step S66) are corrected based on these physical models, and the corrected conditions are applied to the processing of the wafer W'. In an example, the physical models are constructed by repeating a cycle including processing execution, correlation acquisition, and condition correction. The construction of the physical models may be performed by machine learning. According to such a modification, the processing on the wafer W may be performed in a shorter time with higher accuracy than the processing on the wafer W.

(Effect of Embodiment)

The plasma processing method according to the embodiment includes a process (a), a process (b), a process (c), and a process (d). In the process (a), a substrate having a recess is provided in a processing container. In the process (b), plasma is generated in the processing container to form a film on the recess. In the process (c), a state of the plasma generated in the process (b) is monitored. In the process (d), necessity of re-execution of the process (b) and a processing condition for the re-execution are determined based on the monitored plasma state. Thus, according to the plasma processing method according to the embodiment, there is no need to inspect the pattern itself on the substrate, and by estimating the film formation state, it is possible to determine the necessity of re-execution of the film formation process and the processing condition suitable for a case of the re-execution. In addition, in the present plasma processing method, in order to monitor the plasma state during the film formation process, it is possible to estimate the film formation state without carrying the substrate out of the processing container. Thus, according to the present plasma processing method, it is possible to easily determine the ending timing of the film formation process with high accuracy. Thus, in the present plasma processing method, it is possible to stabilize the performance of the film formation process using plasma.

In addition, in the plasma processing method according to the embodiment, the process (b) may include a process (b-1) and a process (b-2). In the process (b-1), a first gas may be introduced into the processing container and may be adsorbed on the recess. In the process (b-2), a second gas may be introduced into the processing container so that plasma of the second gas may be generated and reacted with a component of the first gas adsorbed on the recess to form a film. Then, in the process (c), a state of the plasma generated in the process (b-2) may be monitored. As described above, the plasma processing method according to the embodiment may be applicable to a film formation process, for example, ALD, which is realized in two stages of the adsorption of the first gas and the reaction of the second gas.

In addition, the plasma processing method according to the embodiment, the process (b) may be ended before reaction between the component of the first gas and the component of the second gas is saturated on an entire surface of the recess. As described above, the plasma processing method according to the embodiment may be used to determine the ending timing of the film formation process in the sub-conformal ALD. Thus, according to the plasma processing method according to the embodiment, the ending timing of the film formation process may be highly accurately estimated, and then the film formation process may be ended before the film formed by the sub-conformal ALD reaches a saturation state.

In addition, the plasma processing method according to the embodiment, in the process (c), a physical quantity indicating the plasma state may be monitored. Then, in the process (d), when an integrated value of the physical quantities obtained by monitoring is less than a predetermined value, re-execution of the process (b) is determined. Thus, according to the plasma processing method according to the embodiment, based on the integrated value of the physical quantities obtained by monitoring during the film formation process, it is possible to highly accurately estimate the state of the film formed from the processing start to that point in time. Thus, in the embodiment, even if the film formation process is interrupted for some reason, it is possible to estimate the film formation state at that point in time based on the monitoring result, and to resume the film formation process in order to make up for the shortage.

In addition, the plasma processing method according to the embodiment, in the process (c), an amount of radicals in the plasma generated in the process (b) may be monitored. The amount of radicals may be calculated based on, for example, an electron density and an ion density. In addition, when the temperature in the processing container and the pattern shape on the substrate as a processing target are known, it is possible to estimate the film formation state based on the amount of radicals. Thus, according to the embodiment, it is possible to easily estimate the film formation state on the substrate by using the physical quantity that may be acquired by, for example, an emission spectroscopic sensor.

In addition, the plasma processing method according to the embodiment, in the process (c), the plasma state in each of regions set in a surface where the substrate is disposed may be monitored. In the process (d), when an integrated value of physical quantities indicating the plasma state in each of the regions is less than a predetermined value, re-execution of the process (b) is determined. Thus, according to the embodiment, it is possible to determine the necessity of re-execution of the film formation process by estimating the film formation state in each region in the substrate plane.

In addition, the plasma processing method according to the embodiment, in the process (c), the plasma state in each of regions set in a surface where the substrate is disposed may be monitored. Then, in the process (d), physical quantities indicating the plasma state in the regions, respectively, may be compared, and re-execution of the process (b) is determined when a difference is larger than a predetermined value. Thus, in the embodiment, it is possible to re-execute the film formation process such that the film formation state may become uniform in the regions in the substrate plane. Thus, the plasma processing method according to the embodiment may improve the in-plane uniformity in the film formation process.

In addition, the plasma processing method according to the embodiment may further include a process (e), and a process (f). In the process (e), a state of the film on the recess is detected after the process (b) is executed. In the process (f), the process (b) is re-executed according to a detection result of the process (e). Thus, according to the plasma processing method according to the embodiment, through not only the monitoring of the plasma state, but also detection of the film state, it is possible to determine whether to further re-execute the film formation process. Thus, in the embodiment, it is possible to stabilize the performance of the film formation process using plasma and to realize highly accurate film formation.

In addition, the plasma processing method according to the embodiment may further include a process (e), a process (f), and a process (g). In the process (e), a state of the film on the recess is detected after the process (b) is executed. In the process (f), processing conditions according to a detection result of the process (e) are determined. In the process (g), a base layer of a layer having the film formed on the recess is etched by using the layer as a mask, under the processing conditions determined in the process (f). Thus, in the embodiment, according to the film formation result, it is possible to adjust processing conditions of subsequent etching, and to realize highly accurate pattern formation.

In addition, the plasma processing method according to the embodiment may further include a process (h). In the process (h), after the process (g) is executed, a shape of a pattern formed by the etching and/or the state of the film on the recess are detected, and then the process (b) or the process (g) is re-executed when a degree of coincidence between the detected shape and a predetermined shape is equal to or lower than a predetermined value. Thus, in the embodiment, it is possible to determine whether to further execute etching according to the shape after the etching. Thus, in the embodiment, it is possible to realize highly accurate pattern formation.

In addition, the plasma processing method according to the embodiment may further include a process (i) and a process (j). In the process (i), a shape of the recess is detected before the process (b) is executed. In the process (j), processing conditions of the process (b) are determined according to a detection result of the process (i). Thus, in the embodiment, it is possible to determine processing conditions according to the state of the pattern on the substrate before the film formation or the etching is executed. Thus, in the embodiment, it is possible to realize highly accurate pattern formation.

In addition, the plasma processing method according to the embodiment may further include a process (k), a process (l), and a process (m). In the process (k), correlation between the shape of the recess before film formation, the plasma state, and the state of the film formed in the process (b) is obtained based on the shape of the recess of the substrate before execution of the process (b), the plasma state monitored in the process (c), and the state of the recess of the substrate after execution of the process (b). In the process (l), the processing conditions in the process (b) are corrected based on the obtained correlation. In the process (m), plasma processing is executed by applying the corrected processing conditions to a substrate (a substrate to be processed after the substrate) different from the substrate on which, for example, the process (k), the process (l) and the process (m) have been executed. Thus, in the embodiment, each time the film formation process is executed on the substrate, it is possible to optimize the film formation conditions.

In addition, the plasma processing method according to the embodiment may include a process (n), a process (o), a process (p), and a process (q). In the process (n), after the process (g) is executed, a shape of a pattern formed by the etching and/or the state of the film on the recess are detected. In the process (o), correlation between the state of the film before and after the process (g), the plasma state, and the shape of the pattern after the process (g) is obtained based on the state of the film detected in the process (e), the plasma state monitored in the process (c), and the shape of the pattern and/or the state of the film on the recess detected in the process (n). In the process (p), the processing conditions in the process (g) are corrected based on the obtained correlation. In the process (q), under the corrected processing conditions, a substrate different from the substrate on which, for example, the process (n), the process (o) and the process (p) have been executed is etched. Thus, in the embodiment, each time the substrate is etched, etching conditions may be optimized.

In addition, the plasma processing apparatus according to the embodiment includes one or more processing containers and a controller. In addition, at least one of one or more processing containers is configured to perform etching. At least one of one or more processing containers is configured to perform film formation. One processing container may be configured to perform etching and film formation. The processing container includes a gas supply configured to supply a processing gas therein. The controller causes each of units to execute a plasma processing method including a process (a), a process (b), a process (c), and a process (d). In the process (a), a substrate having a recess is provided in the processing container. In the process (b), plasma is generated in the processing container to form a film on the recess. In the process (c), a state of the plasma generated in the process (b) is monitored. In the process (d), necessity of re-execution of the process (b) and processing conditions for the re-execution are determined based on the monitored plasma state. Thus, the plasma processing apparatus according to the embodiment may stabilize the performance of the film formation process using plasma, and may realize highly accurate pattern formation.

A target to which the plasma processing method according to the embodiment is applied is not particularly limited as long as it is substrate processing using plasma. In addition, the plasma processing method according to the embodiment may be used in a 3D NAND or DRAM manufacturing process. In addition, the plasma processing method according to the embodiment may be used in, for example, processing of a high AR (aspect ratio) organic film, or processing of a mask for logic.

According to the present disclosure, it is possible to stabilize the performance of a film formation process using plasma.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:
1. A plasma processing method comprising:
(a) providing a plasma processing system including:
  a plurality of plasma processing apparatuses,
  at least one of the plurality of plasma processes apparatuses including:
    a chamber, the chamber including a substrate support and a plasma generator facing the substrate support, and wherein a substrate having a recess is positioned on the substrate support in the chamber
    a first sensor for monitoring a state of plasma generated in the chamber, and
    a controller;
  an observation device including a second sensor provided outside the at least one of the plurality of plasma processing apparatuses,

(b) detecting a pattern shape on the substrate using the second sensor;
(c) generating plasma in the chamber under a first processing condition determined based on the results of (b), thereby forming a film on the recess, the film being formed on an upper side of a side wall of the recess and on a top surface outside of the recess and adjacent the recess, and not being formed on a lower side of the side wall and a bottom of the recess;
(d) monitoring a state of the plasma generated in (c) using the first sensor;
(e) determining, based on the state of the plasma monitored in (d), a necessity of re-execution of (c), and a second processing condition for the re-execution of of (c);
(f) detecting, using the second sensor, a pattern shape of the substrate on which the film is formed when it is determined in (e) that (c) is not to be re-executed;
(g) etching a base layer under a third processing condition determined based on the results of (f), the etching of the base layer including using a layer having the film formed thereon as a mask;
wherein (c) includes:
(c-1) introducing a first gas into the chamber and causing the first gas to be adsorbed on the recess,
(c-2) purging an inside of the chamber,
(c-3) introducing a second gas into the chamber to generate the plasma from the second gas and reacting a component of the second gas with a component of the first gas adsorbed on the recess, thereby forming the film,
(c-4) purging the inside of the chamber, and
(c-5) repeating (c-1), (c-2), (c-3), and (c-4) in a cycle, and
wherein:
at least one of: (1) in (c-1), the gas is adsorbed on only a part of the recess, and/or (2) in (c-3), (c-3) is ended before a reaction between the component of the first gas and the component of the second gas is saturated over an entire surface of the recess,
in (c), the film is formed on the side wall such that a thickness of the film gradually decreases from the upper side of the side wall toward a bottom of the recess,
(d) includes monitoring the state of the plasma in each of a plurality of regions where the substrate is disposed,
in (e), (c) is determined to be re-executed when an integral value of a physical quantity obtained in (d) that is indicative of the state of the plasma in each of the plurality of regions is less than a predetermined value, the physical quantity including at least one parameter selected from a parameter group consisting of an electron density, an ion density, a molecular radical density, and an atomic molecular ion mass,
(e) is performed before (c-4), after (c-4), or in parallel with (c-4), and
(g) is performed in a different plasma processing apparatus than (c), and
wherein:
the first processing condition includes at least one selected from a parameter group consisting of a temperature of a stage on which the substrate is disposed, a pressure of the chamber, an introduction flow rate of the first gas, an introduction time of the first gas, and a processing time,
the second processing condition includes at least one of a processing time for re-executing (c-1), a processing time for re-executing (c-3), re-executing (c) starting from (c-1), and re-executing (c) starting from (c-3),
the third processing condition includes at least one of an introduction amount of an etching gas, a radio-frequency power, and a substrate temperature.

2. The plasma processing method according to claim 1, wherein in (c), a sub-conformal film is formed on the recess.

3. The plasma processing method according to claim 1, wherein in (c-3), a position where the film is formed on the recess is controlled by adjusting at least one parameter selected from a parameter group consisting of a temperature of a stage on which the substrate is disposed, a pressure of the chamber, an introduction flow rate of the second gas, an introduction time of the second gas, a processing time, and a radio-frequency power for plasma generation.

4. The plasma processing method according to claim 1, wherein in (d), an amount of radicals in the plasma generated in (c) is monitored.

5. The plasma processing method according to claim 1, wherein
in (e), physical quantities indicating the state of the plasma state in the regions are compared, and when a difference is larger than a predetermined value, re-execution of (c) is determined.

6. The plasma processing method according to claim 1, wherein (f) includes:
(f-1) detecting a state of the film on the recess after (c); and
(f-2) re-executing (c) according to a detection result of (f-1).

7. The plasma processing method according to claim 6, further comprising:
(i) detecting a shape of the recess before (c); and
(j) determining a processing condition of (c) according to a detection result of (i).

8. The plasma processing method according to claim 7, comprising:
(k) obtaining correlation between the shape of the recess before film formation, the state of the plasma, and the state of the film formed in (c) based on the shape of the recess detected in (i), the state of the plasma monitored in (d), and the pattern shape of the substrate detected in (f);
(l) correcting the processing condition in (c) based on the correlation; and
(m) forming a film on a recess of a substrate different from the substrate under the processing condition corrected in (l).

9. The plasma processing method according to claim 1, wherein (f) includes:
(f-1) detecting a state of the film on the recess after (c);
(f-2) determining a processing condition according to a detection result of (f-1); and
wherein (g) includes etching the base layer under the processing condition determined in (f-2).

10. The plasma processing method according to claim 9, further comprising:
(h) detecting a shape of a pattern formed by the etching and/or the state of the film on the recess after (g), and re-executing (c) or (g) when a degree of coincidence between the shape detected in (h) and a predetermined shape is equal to or lower than a predetermined value.

11. The plasma processing method according to claim 9, comprising:
(i) detecting a shape of the recess before (c);

(n) detecting a shape of a pattern formed by the etching and/or the state of the film on the recess after (g);

(o) obtaining correlation between the state of the film before and after (g), the state of the plasma, and the shape of the pattern after (g) based on the state of the film detected in (f), the state of the plasma monitored in (d), and the shape of the pattern and/or the state of the film on the recess detected in (n);

(p) correcting the processing condition in (g) based on the correlation; and (q) etching a substrate different from the substrate under the processing condition corrected in (p).

12. The plasma processing method according to claim 1, wherein the first sensor monitors a physical quantity indicating a state of the plasma, and the second sensor optically determines a quantity relating to the pattern shape on the substrate.

13. The plasma processing according to claim 12, wherein the physical quantity indicating a state of the plasma is a quantity from which an amount of radicals in the plasma may be estimated.

14. The plasma processing method according to claim 1, wherein in (e) variations in in-plane uniformity are determined based on the state of the plasma monitored in (d), and further wherein based on determined variations in in-plane uniformity the second processing condition for re-execution of (c) is changed.

15. A plasma processing method comprising:
providing a plasma processing apparatus, the plasma processing apparatus including a chamber having a substrate provided therein, the substrate having a recess;
generating plasma in the chamber thereby forming a film on the recess, the film being formed on an upper side of a side wall of the recess and on a top surface outside of the recess adjacent the recess, and not being formed on a lower side of the side wall and a bottom of the recess;
monitoring a state of the plasma generated in the generating using a first sensor;
detecting a pattern shape on the substrate using a second sensor;
determining a necessity of re-execution of the generating of the plasma;
detecting, using the second sensor, a pattern shape of the substrate on which the film is formed when the generating of the plasma is not to be re-executed;
etching a base layer using a layer having the film formed thereon as a mask;
wherein the generating of the plasma includes:
introducing a first gas into the chamber and causing the first gas to be adsorbed on only a part of the recess, and
introducing a second gas into the chamber and reacting a component of the second gas with a component of the first gas adsorbed on the recess, thereby forming the film, and
wherein:
the generating of the plasma is stopped before a reaction between the component of the first gas and the component of the second gas is saturated over an entire surface of the recess, and
the film is formed on the side wall such that a thickness of the film gradually decreases from the upper side of the side wall toward a bottom of the recess.

16. The plasma processing method according to claim 15, wherein the first sensor monitors a physical quantity from which an amount of radicals in the plasma may be estimated, and the second sensor optically determines a quantity relating to the pattern shape.

17. The plasma processing according to claim 15, wherein variations in in-plane uniformity are determined based on the monitoring; and
when the generating the plasma is re-executed, at least one plasma condition is changed based on determined variations in the in-plane uniformity.

18. The plasma processing method according to claim 15, wherein based on the detecting using the second sensor, a determination is made to re-execute the generating the plasma or to not re-execute the generating plasma, and wherein:
in response to a determination to re-execute the generating the plasma, generating the plasma is re-executed with at least one processing condition changed compared to an immediately proceeding generating of the plasma; and
in response to a determination to not re-execute the generating the plasma, the etching is performed.

* * * * *